United States Patent
Banin et al.

(10) Patent No.: US 7,964,278 B2
(45) Date of Patent: Jun. 21, 2011

(54) III-V SEMICONDUCTOR CORE-HETEROSHELL NANOCRYSTALS

(75) Inventors: Uri Banin, Mevasseret Zion (IL); Assaf Aharoni, Moshav Aminadav (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 310 days.

(21) Appl. No.: 11/922,008

(22) PCT Filed: Jun. 15, 2006

(86) PCT No.: PCT/IL2006/000695
§ 371 (c)(1),
(2), (4) Date: Jun. 19, 2008

(87) PCT Pub. No.: WO2006/134599
PCT Pub. Date: Dec. 21, 2006

(65) Prior Publication Data
US 2009/0230382 A1 Sep. 17, 2009

Related U.S. Application Data

(60) Provisional application No. 60/690,474, filed on Jun. 15, 2005.

(51) Int. Cl.
*B32B 15/02* (2006.01)
(52) U.S. Cl. ......................... 428/403; 257/103
(58) Field of Classification Search .................. 428/403; 257/103, 613, 615; 372/45.012
See application file for complete search history.

(56) References Cited

U.S. PATENT DOCUMENTS

| 6,319,426 B1 | 11/2001 | Bawendi et al. |
| 2002/0004246 A1 | 1/2002 | Daniels et al. |
| 2005/0002635 A1 | 1/2005 | Banin et al. |
| 2006/0157720 A1 | 7/2006 | Bawendi et al. |
| 2009/0230382 A1* | 9/2009 | Banin et al. ............ 257/14 |

FOREIGN PATENT DOCUMENTS

| WO | 02/25745 A2 | 3/2002 |
| WO | 02/25745 A3 | 3/2003 |
| WO | 2004/066361 A2 | 8/2004 |
| WO | 2004/066361 A3 | 8/2004 |

OTHER PUBLICATIONS

Li, J., et al. "Large-Scale Synthesis of Nearly Monodisperse Cd/Cds Core/Shell Nanocrystals Using Air-Stable Reagents via Succesive Ion Layer Adsorption and Reaction", *J. Am. Chem. Soc.*, vol. No. 125, pp. No. 12567-12575, (2003).

Talapin, V., et al. "CdSe/CdS/ZnS and CdSe/ZnSe/ ZnS Core-Shell Nanocrystals", *J. Phys. Chem B*, vol. No. 108, No. pp. 18826-18831, (2004).

(Continued)

*Primary Examiner* — Mark Prenty
(74) *Attorney, Agent, or Firm* — The Nath Law Group; Susanne M. Hopkins; Ari G. Zytcer

(57) ABSTRACT

The present invention provides a core/multishell semiconductor nanocrystal comprising a core and multiple shells, which exhibits a type-I band offset and high photoluminescence quantum yield providing bright tunable emission covering the visible range from about 400 nm to NIR over 1600 nm.

33 Claims, 9 Drawing Sheets

OTHER PUBLICATIONS

Xie, R., et al. "Synthesis and Characterization of Highly Luminescent CdSe-Core CdS/$Zn_{0.5}Cd_{0.5}$S/ZnS Multishell Nanocrystals", *J. Am. Chem. Soc.*, vol. No. 127, pp. No. 7480-7488, (2005).

Haubold, S. et al. "Strongly Luminescent InP/ZnS Core-Shell Nanoparticles", *Chem. Phys. Chem.*, vol. No. 5, pp. No. 331-334, (2001).

Mews, A. et al. "Preparation and Characterization, and Photophysics of the Quantum Dot Quantum Well System DdS/HgS/CdS", *J. Phys. Chem.*, vol. No. 98, pp. No. 934-941, (1994).

Aharoni, A., et al. "Synthesis of InAs/CdSe/ZnSe Core/Shell1/Shell2 Structures with Bright and Stable Near-Infrared Fluorescence", *J. Am. Chem. Soc.*, vol. No. 128, pp. No. 257-264, (2006).

* cited by examiner

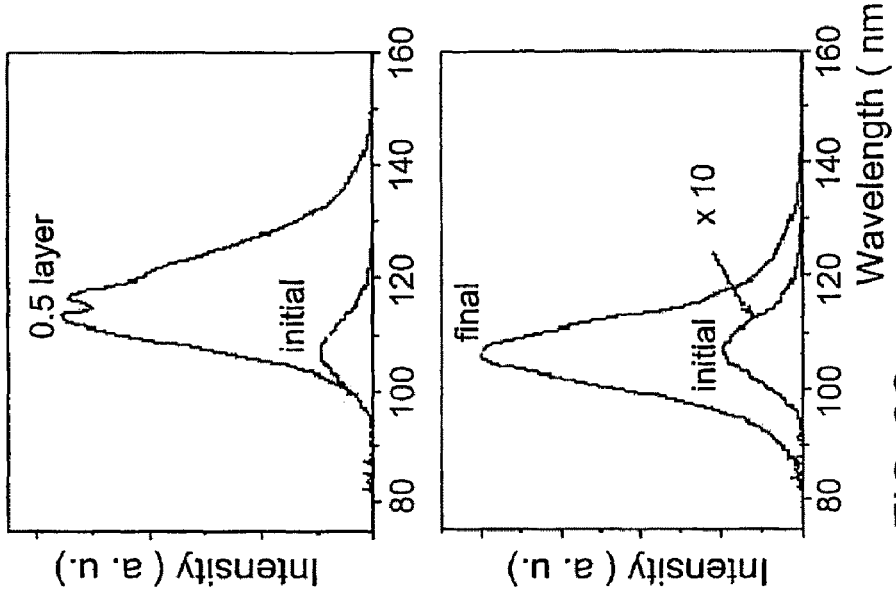
FIG. 2B
FIG. 2C
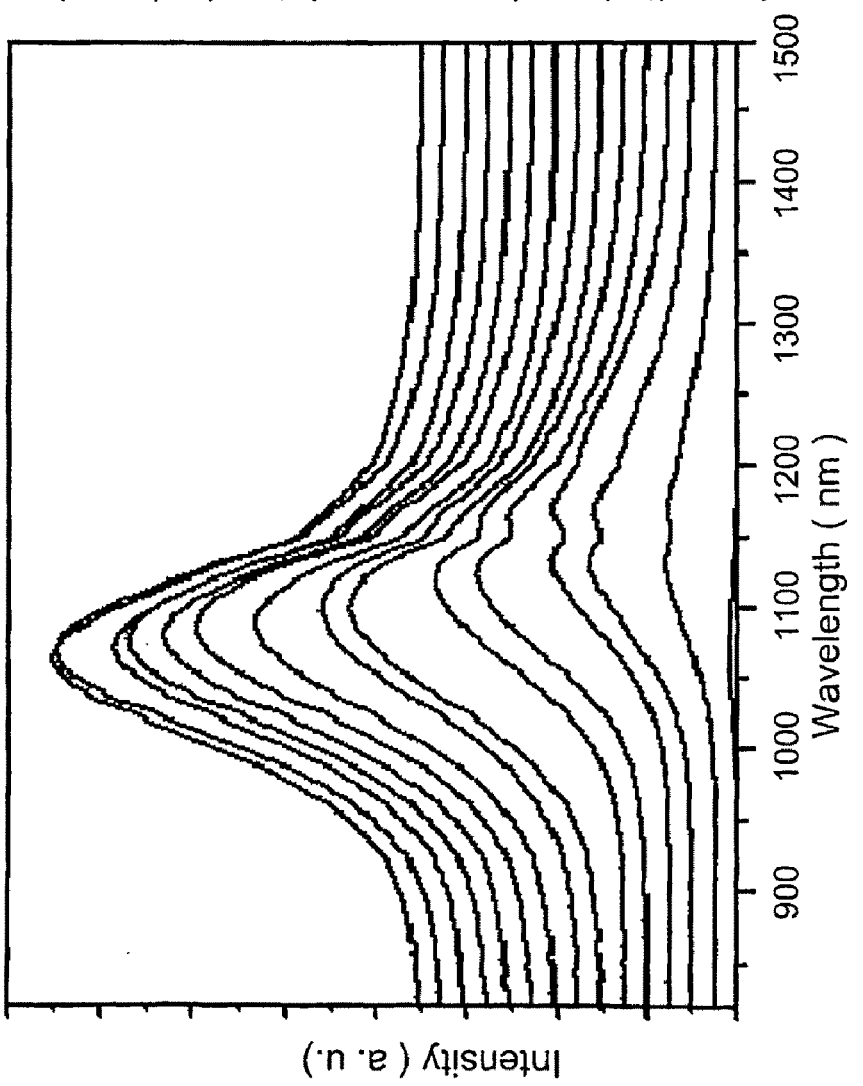
FIG. 2A

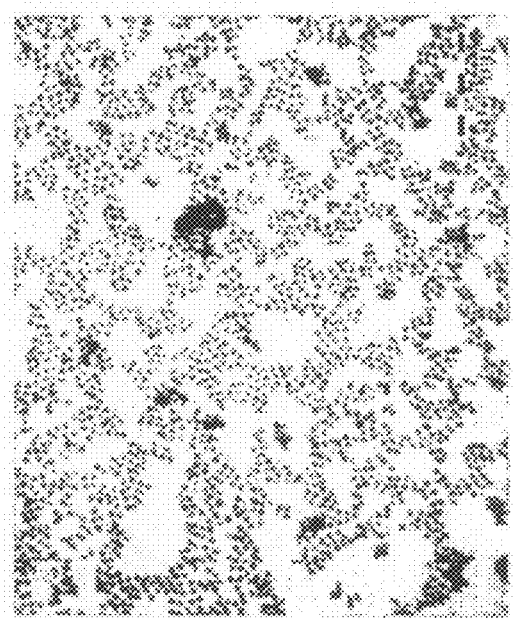
FIG. 8A
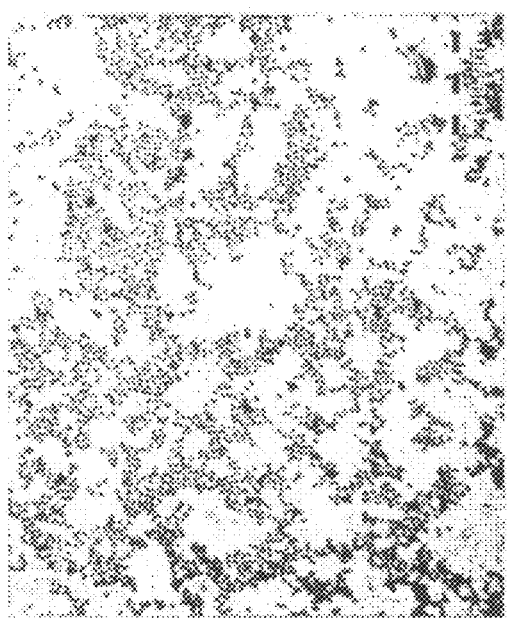
FIG. 8B
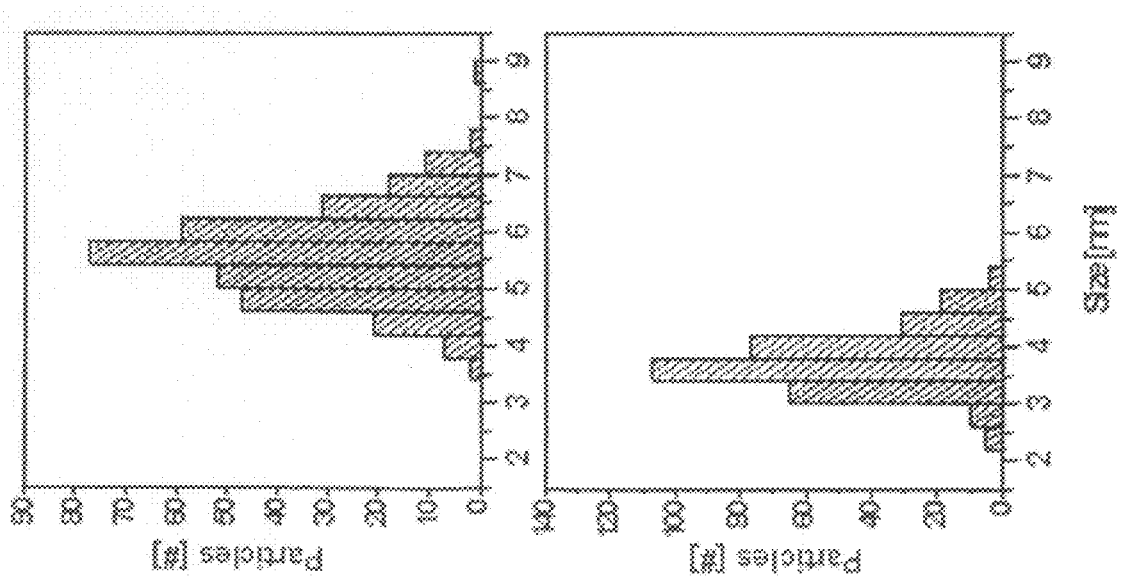

III-V SEMICONDUCTOR CORE-HETEROSHELL NANOCRYSTALS

CROSS-REFERENCE

This is a National Phase Application filed under 35 USC 371 of International Application No. PCT/IL2006/000695, filed Jun. 15, 2006, claiming the benefit under 35 USC 119(e) of U.S. Provisional Application No. 60/690,474, filed Jun. 15, 2005, the entire content of each of which is hereby incorporated herein by reference in its entirety.

FIELD OF THE INVENTION

This invention relates to the manufacture and use of core/multishell semiconductor nanocrystals.

BACKGROUND OF THE INVENTION

The need for nanocrystals with bright and stable fluorescence for various applications covering biology to electrooptics is increasingly growing. This is particularly true for III-V semiconductor nanocrystals that can cover the technologically important visible to near infrared (NIR) spectral ranges and at the same time be used for large scale implementation stemming from their environmentally benign (e.g. InP) character.

The main strategy to increase photoluminescence quantum yield and stability of the nanocrystals is to grow a passivating shell on the cores surface. This removes surface defects acting as traps for the carriers and therefore reduces the probability for the undesired processes of emission quenching via nonradiative decay. Moreover, the passivating shell protects the core and reduces surface degradation. Two main factors are considered while choosing the semiconductor material for the passivating shell: the first is the lattice mismatch between the core and shell materials. A large lattice mismatch will cause strain at the core/shell interface that can lead to creation of defect sites acting as trap sites for the charge carriers. The second factor is the band offsets between the core and shell regions that should be sufficiently high so that carriers are confined into the core region and kept separated from the surface where defects can lead to the undesired nonradiative relaxation processes. This latter effect is particularly critical in III-V semiconductors that typically are characterized by small effective masses for the charge carriers requiring a large potential barrier for their confinement.

Earlier work on core/shell nanocrystals resulted in quantum yield values of up to 90% for II-VI/II-VI core/shell structures and up to 20% for III-V/II-VI core/shell structures (Banin et al in WO02/25745 and by Haubold et al in Chem. Phys. Chem., (2001) 2, 331). For the III-V structures there is still significant room for improvement in the quantum yield values, but even for the II-VI structures showing high quantum yield, the shell thickness corresponding to these maximal quantum yields is small, typically only of about 2 monolayers. This limitation is likely due to traps created by structure imperfections formed in the growth process. A thick shell is important for the stability of the nanocrystals, especially for applications in which they are exposed to tough processes.

A solution to this problem was given in the work of Li et al (J. Am. Chem. Soc., (2003) 125, 12567-12575), in which a layer-by-layer growth method was used. A layer-by-layer growth was previously also used to create CdS/HgS/CdS quantum dot-quantum well structures (Mews et al., J. Phys. Chem., (1994) 98, 934). In this method the cation and anion shell precursors are added sequentially into the reaction vessel. Another solution to the problem of increased stress with shell thickness is to grow a heteroshell structure in which a buffer layer is used to decrease stress in the shell.

In international publication no. WO04/066361 high photoluminescence quantum yield compositions containing monodispersed colloidal core/shell semiconductor nanocrystals and doped or radially-doped core/multishell nanocrystals are disclosed. The preparation of multi-shelled structures such as the core/shell/shell containing CdSe cores has also been demonstrated, for example by Talapin et al in J. Phys. Chem. (2004) B 108, 18826 and by Mews et al in J. Amer. Chem. Soc., (2005) 127, 7480-7488.

SUMMARY OF THE INVENTION

By implementing the layer-by-layer in-solution growth technique, a complex core/multishell heterostructure having a III-V semiconductor core and at least two layers, herein referred to as shells, coating it, has now been prepared. This structure yields exceptional fluorescence quantum yield which remains very high even upon ligand exchange and transformation to a water environment. The complex heterostructure is further characterized as having the following characteristics:
  (i) they exhibit high photoluminescence quantum yields providing bright tunable emission covering the visible range from about 400 nm to NIR over 1600 nm;
  (ii) they exhibit narrow distribution of sizes leading also to excellent emission spectra;
  (iii) they provide exceptional stability;
  (iv) they are environmentally benign and thus may be used in therapeutic or diagnostic methods on or related to the human body; and
  (v) they may be implemented in variety of applications, e.g., in biological fluorescence tagging, and electrooptical devices such as those required in telecommunications fiber-optics.

Thus, the present invention provides generally a core/multishell semiconductor nanocrystal made of semiconductor materials and having the aforementioned characteristics. The nanocrystals or (as used interchangeably) the heterostructures of the invention are undoped and are not quantum wells.

The term "heterostructure" as used within the context of the present invention, refers to an undoped semiconductor structure in which the chemical composition changes with position. The heterostructure of the invention is made of a core material and multishell materials, where each shell material sequentially coats an underlying shell, thus producing core/multishell assemblies such as core/shell1/shell2, core/shell1/shell2/shell3 and the like. The heterostructure of the invention is a "nanocrystal", namely, it is a particle of nanometer dimensions, typically 2-100 nm in diameter that has a crystalline core structure, resembling the crystal structure of the bulk from which it is derived. The nanocrystal surface is usually coated by a ligand layer constituting suitable molecules with affinity to the particle surface.

The general structure "core/multishell" refers therefore to a heterostructure having a single core and at least two shells, each of which being designated as e.g. shell1, shell2, etc, where shell1 is the innermost shell, shell2 is the next shell and so on. For example, a heterostructure represented by the expression "core/shell1/shell2" corresponds to the heterostructure having a core of one semiconductor material, which is coated by shell1 of a different semiconductor composition, which in turn is coated with a shell2 material of yet another semiconductor material. In this exemplary case, shell2 is the external or outermost coating of the core.

Each of the core and shell materials is different and has different energy profiles. The energy profile of the core and shell materials increases in a direction away from the core towards the external shell, resulting in an energy profile of the whole heterostructure that pictorially resembles the Russian nesting dolls "matryoshka" or "babushka", where a small doll is nested within a larger doll and the larger doll in turn nests within even a larger doll and so on. The potential energy scheme for such a structure is depicted in the potential energy diagram of FIG. 1.

The term "core" refers to the innermost semiconductor material contained in the heterostructure of the invention and which is characterized as a quantum dot. Typically the core has a nearly spherical shape. However, cores of various shapes such as pseudo-pyramid, cube-octahedron and others have been used. Typical core diameters range from about 2 to about 20 nm. The term "core material" refers within the context of the present invention to the semiconductor material from which the core is made.

The term "multishell" is used to designate the multiple shells structure of the heterostructure. The term "shell material" refers within the context of the present invention to the semiconductor material from which each of the shells is made.

In a first aspect of the present invention, there is provided a core/multishell semiconductor nanocrystal comprising a core material made of a III/V compound and at least two shell materials, wherein a first shell material coats the core material, a second shell material coats the first shell material, and sequentially each subsequent shell material coats the preceding shell, each shell material being independently selected from a II/VI, III/V or III/VI compound, wherein the core material is different from the first shell material, and any shell material is different from the shell material of the adjacent shells, and wherein the said nanocrystal exhibits a type-I band offset.

In one embodiment, the nanocrystals exhibit luminescence at a wavelength from about 400 to about 1600 nm. In another embodiment, a plurality of such nanocrystals exhibit luminescence at a wavelength from about 400 to about 1600 nm.

In another embodiment of the invention, the core/multishell semiconductor nanocrystal comprises a single core and between 2 and 7 shells, each of which composed of a different semiconductor material independently selected from III-V, II-VI and III-VI compounds. In another embodiment, the core/multishell structure comprises a core and between 2 and 4 shells.

It should be noted that each of said multiple shells may be of a different thickness and be composed of numerous layers of the same composition, wherein the number of layers making each shell determines the thickness of the shell. In other words, the boundaries of each shell is determined by the reversion of one semiconductor material to another, allowing each of the shells to be composed of numerous layers of the same semiconductor material.

The term "type I" refers to the energetic structure of the heterostructure in which the conduction and valence band offsets of consecutive shell materials is such that the conduction band position is higher for each consecutive shell compared to the core and/or to the shells which are closer thereto, and for the valence band, the position is lower for each consecutive shell compared to the core and/or shells which are closer thereto. Thus, the band gap (the energetic gap between the conduction and valence bands) of said at least two shell materials is said to be larger than the band gap of the core material, and is also said to increase from the core outwards.

In other words, the band gap of the core material is less than the band gap of the first and subsequent shell materials, the band gap of the first shell material is larger than the band gap of the core material and lower than the band gap of subsequent shell material which coats it (i.e. which is more distant from the core), which in turn has a band gap which is larger than the core and any of the inner shells and lower than the band gap of the shell materials coating it.

The term "III/V compound" is used to describe a crystalline material or solid solution formed from the reaction of at least one metal precursor from group IIIa of the Periodic Table of the Elements (B, Al, Ga, In, and Tl) and at least one element from group Va of the Periodic Table of the Elements (N, P, As, Sb, and Bi). It should be noted that a particular Group IIIa metal precursor may be reacted with more than one particular Group Va precursor forming a multi atom structure, such as GaAsP, or a particular Group Va precursor reacted with more than one particular Group IIIa metal precursor forming a multi atom structure such as InGaAs. Such multi atom structures are also within the scope of the term.

Examples of III/V compounds that may be used in the present invention are InAs, GaAs, GaP, GaSb, InP, InSb, AlAs, AlP, AlSb and alloys such as InGaAs, GaAsP, InAsP.

The term "III/VI compound" is used to describe a crystalline material or solid solution formed from the reaction of at least one metal precursor from group IIIa of the Periodic Table of the Elements (B, Al, Ga, In, and Tl) and at least one element from group VIa of the Periodic Table of the Elements (O, S, Se, Te). It should be noted that a particular Group IIIa metal precursor may be reacted with more than one particular Group VIa precursor forming a multi atom structure, such as GaTeSe, or a particular Group VIa precursor reacted with more than one particular Group IIIa metal precursor forming a multi atom structure such as $In_4Se_3$. Such multi atom structures are also within the scope of the term.

Examples of III/VI compounds that may be used in the present invention are InS, $In_2S_3$, InSe, $In_2Se_3$, $In_4Se_3$, $In_2Se_3$, InTe, $In_2Se_3$, GaS, $Ga_2Se_3$, GaSe, $Ga_2Se_3$, GaTe, $Ga_2Te_3$, $In_2Se_{3-x}Te_x$, GaTeSe, and $(Ga_xIn_{1-x})Se_3$, wherein X is zero or 1.

The term "II/VI compound" is similarly used to describe crystalline material or solid solution formed from the reaction of at least one metal precursor from group IIa of the Periodic Table of the Elements and at least one element from group VIa of the Periodic Table of the Elements. Examples of Group II-VI compounds are CdS, CdSe, CdTe, ZnS, ZnSe, ZnTe, HgS, HgSe, HgTe and the like and alloys of them such as CdZnSe, CdSSe, ZnSSe and the like.

In a preferred embodiment, the present invention provides core/shell1/shell2 semiconductor nanocrystals comprising a core material made of a III/V compound and two shell materials each made of a different II/VI, III/V or III/VI compound wherein the first shell material (i.e. shell 1) coats the core material and the second shell material (i.e. shell 2) coats said first shell material, wherein the energetic structure of said nanocrystal is of type-I.

Preferably, the core/shell1/shell2 semiconductor nanocrystal is selected from InAs/CdSe/ZnS, InAs/CdSe/CdS, InAs/InP/ZnSe, InP/ZnSe/ZnS, InP/CdS/ZnSe, InP/CdS/ZnSe, GaAs/CdSe/ZnS, GaAs/CdS/ZnS. Most preferably, the nanocrystal is InAs/CdSe/ZnS or InP/ZnSe/ZnS.

In another aspect of the present invention, there is provided a "wet" method for the manufacture of the core/multishell semiconductor nanocrystals of the invention, said method comprising:

(i) providing a core,
(ii) contacting said core in solution with a first solution of a soluble cation or soluble anion selected from the Group of IIIa, IIa, Va or VIa ions, allowing said cation or anion to react on said core,
(iii) contacting the core in solution with the counter ion of said first soluble cation or soluble anion solution of step (ii), said counter ion being selected from Group of IIIa, IIa, Va or VIa ions, and allowing said counter ion to react and afford a core/shell1 structure,
(iv) contacting said core/shell1 structure in solution with a second solution of a soluble cation or soluble anion selected from the Group of IIIa, IIa, Va or VIa, ions allowing said cation or anion to react on shell1 of said core/shell1 structure,
(v) contacting said core/shell1 structure in solution with the counterion of said second soluble cation or soluble anion solution of step (iv), said counter ion being selected from Group of IIIa, IIa, Va or VIa ions, and allowing to react and afford a core/shell1/shell2 structure,
(vi) optionally repeating steps (ii) to (v) to form a core/multishell semiconductor nanocrystal of a higher order.

In one embodiment, the core/shell1 structure of step (iii) is selected from InAs/CdSe, InAs/CdSe, InAs/InP, InP/ZnSe, InP/CdS, InP/CdS, GaAs/CdSe, and GaAs/CdS. The core/shell1/shell2 structure of step (v) is selected from InAs/CdSe/ZnS, InAs/CdSe/CdS, InAs/InP/ZnSe, InP/ZnSe/ZnS, InP/CdS/ZnSe, InP/CdS/ZnSe, GaAs/CdSe/ZnS, and GaAs/CdS/ZnS.

In another embodiment, the steps of contacting the core with the various precursor solutions (steps ii to v) are carried out at temperatures exceeding 200° C.

The heterostructures thus obtained may be collected from the reaction solution as aggregates. On their outer shell the heterostructures may be covered by an organic layer of long chained amine ligands such as Decylamine, Dodecylamine, and Tributylamine which coordinate with the metal ions of the outer shell and increase their solubility in the solvent.

In a further aspect, the invention relates to a wideband optical amplifier for amplifying data-carrying optical signals, comprising a plurality of core/multishell semiconductor nanocrystals, wherein each of said core/multishell nanocrystals has core dimensions that correspond to a specific optical band and is located at a predetermined point within a light transmitting medium; and a pumping, coherent-light source connected to said light transmitting medium for exciting each of said nanocrystals with light energy required for the amplification of data-carrying optical signals within said specific optical band, received in said light transmitting medium.

In an additional aspect, the invention relates to a light-emitting diode comprising the core/multishell semiconductor nanocrystals of the invention.

The core/multishell semiconductor nanocrystals of the invention may also be used as biological labeling agents, photoelectric devices, laser devices or in optical data communication systems.

The present invention further provides for a host material containing a plurality of the core/multishell semiconductor nanocrystals of the invention. The term "plurality" refers within the context of the present invention to a sufficient amount of the nanocrystals which are capable of exhibiting the characteristics detailed hereinabove.

Preferably, the host material is a polymer, which may be selected from fluorinated polymers, polymers of Ployacrylamide, polymers of Polyacrylic acids, polymers of Polyacrylonitrile, polymers of Polyaniline, polymers of Polybenzophenon, polymers of poly(methyl mathacrylate), silicone polymers, Aluminium polymers, polymers of Polybisphenol, polymers of Polybutadiene, polymers of Polydimethylsiloxane, polymers of Polyethylene, polymers of Polyisobutylene, polymers of Polypropylene, polymers of Polystyrene and Polyvinyl polymers.

In one embodiment, the polymers are selected from polyvinyl and fluorinated polymers. In a most preferred embodiment, the polymer is polyvinyl-butyral or Perfluorocyclobutyl.

BRIEF DESCRIPTION OF THE DRAWINGS

In order to understand the invention and to see how it may be carried out in practice, a preferred embodiment will now be described, by way of non-limiting examples only, with reference to the accompanying drawings, in which:

FIG. 2A-C depicts the evolution of the photoluminescence spectra of 3.8 μm InAs cores as a function of shell thickness: FIG. 2A depicts the intensity of the photoluminescence as the number of layers of InAs increases from (bottom up) 0, 0.5, 1, 1.5, . . . , 7 layers, wherein a full layer number represents a full layer (cation and anion) and a half layer number (e.g. 0.5, 1.5 etc) represents half a layer (cation or anion); FIG. 2B shows the photoluminescence spectrum after the insertion of half a layer of Cd, and FIG. 2C shows the initial photoluminescence spectrum of the core versus the final photoluminescence spectrum of the core/shell1/shell2 particles. The spectra are of aliquots taken during the synthesis of the InAs/CdSe heterostructure taken in Toluene.

In FIG. 3A the circles and solid line shows the quantum yield of 3.8 nm InAs cores as a function of number of layers. The first layer is the CdSe layer. The triangles and dashed line depicts the shift of photoluminescence wavelength as a function of layer number. The growth of the first CdSe layer is followed by a red shift of the photoluminescence which blue shifts back to its initial position after the growth of the following ZnSe layers. In FIG. 3B the spheres and solid line represents as in FIG. 3A the quantum yield of the InAs cores. The squares and dashed line shows the full width at half maximum (FWHM) of the photoluminescence feature versus number of layers. An increase in size distribution is observed after 1.5 layers which is compensated as the ZnSe shell growth continues.

FIG. 8A is a TEM (tunneling electron microscope) picture of 3.8 nm InAs cores and their corresponding size distribution on the left. FIG. 8B is a TEM picture of 5.9 nm InAs/CdSe/ZnSe core/shell/shell QD's synthesized using the InAs cores of FIG. 8A and their corresponding size distribution on the left. Size distributions are 5.6±0.77 nm for the heterostructures of FIG. 8B and 3.8±0.52 nm for the cores of FIG. 8A.

DETAILED DESCRIPTION OF EXEMPLARY EMBODIMENTS

In a general procedure, the core/multishell structures of the invention are manufactured from quantum dots or III-V cores which are first dissolved in a non-coordinating solvent, such as 1-Hexadecene, Hexadecane, Heptadecane, 1-Octadecene, octadecane, Nonadecane, Eicosane, containing a long chained amine compound such as Decylamine, Dodecylamine, or Tributylamine, which serves as a capping ligand or with other ligands such as phosphines (for example trioctylphosphine, tributylphosphine, trioctylphosphine oxide and the like), or with thiols such as hexanethiol, benzenethiol, dodecanthiol and the like. The stock precursor solutions for the cations and anions of the shell materials are introduced into the hot reaction vessel in a sequential manner. As the reaction of one species is complete (half layer) the counter ion is inserted to complete the layer (full layer). This is followed by the growth of additional layers of the same shell, thus affording a shell of a required thickness as desired or instead by growth of the next coating layer, e.g. shell2.

Figure 1:
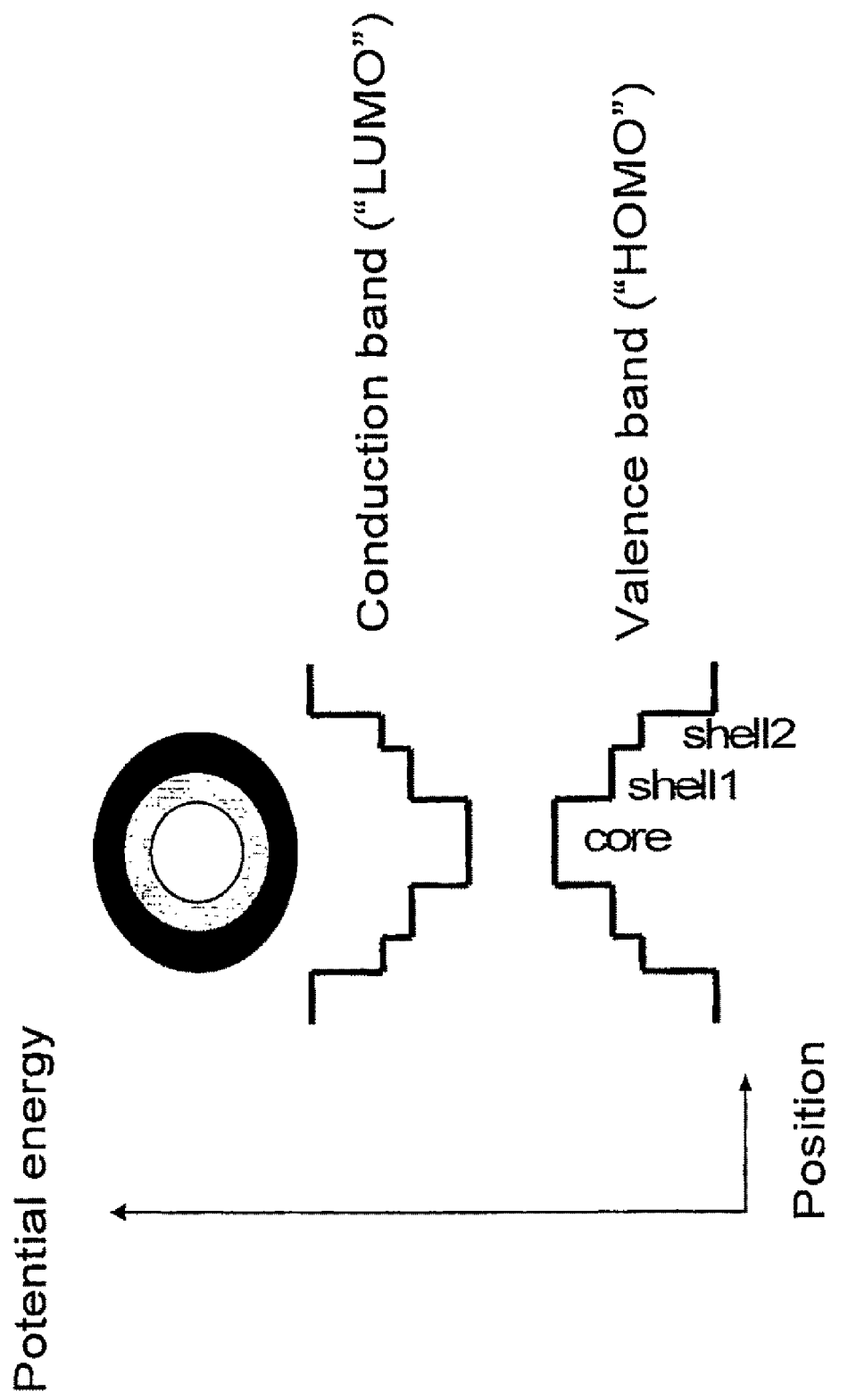
FIG. 1 depicts the potential energy scheme for the heterostructure of the invention.

The semiconductor materials utilized in the construction of the heterostructures should meet the criteria of FIG. 1, namely, semiconductor 1 used as shell1 should have a band gap that is larger than that of the core and the offsets of the bands are such that the gap of the core is enclosed in the gap of the shell. Semiconductor 2 used as the material for shell2 should have a band gap that is larger than the core and shell1, and the offsets of the bands are such that the gap of the core and shell1 is enclosed in the gap of shell2. This rule applies to subsequent shells as well.

The dissolved cores are contacted with precursors of the semiconductor of shell1. The precursors are added in a variable consecutive manner i.e. first the cations (or the anions) precursors are added to the solution containing the core particles and after their reaction on the core particles is complete, their counter ion precursor is inserted so that it reacts next to establish a full layer. This is continued and repeated sequentially, alternating between anions/cations to allow for further shell growth until the desired thickness of shell1 is achieved.

At the second stage shell2 is grown on shell1. Again, in a sequential manner the precursors of anions or cations are added separately followed by their counter ions and shell2 is allowed to grow to a desired thickness. Further shells are added similarly.

The reaction is typically carried at temperatures higher than room temperature. Preferably, the reaction temperatures exceed 200° C. Most preferably the reaction temperature is 260° C.

When the reaction of core/shell1/shell2 . . . is completed, the temperature is reduced to room temperature and the product particles are separated from the growth solution by precipitating the particles by adding a non-solvent to the solution. Examples of non-solvents include polar solvents such as methanol, ethanol, propanol, butanol and other alcohols, acetone and other non-solvents. The particles then aggregate and may next be separated from the solution by centrifugation and/or filtration. The product powder contains the capped core/shell1/shell2 . . . particles. These can be redissolved, as desired, and further processed as needed.

The use of certain semiconductor materials such as InAs as a core and ZnSe as an outer shell material, which have a large lattice mismatch of ~7% may lead to undesirable strain effects which in turn may lead to the creation of defects at the core/shell interface. These defects serve as traps for the carriers, opening effective non-radiative decay routes for the electron-hole path and hence limit the maximal quantum yield achieved, for example at less then two ZnSe shell layers, to about 20%.

Two strategies have been used in order to reduce lattice stress in the heterostructures of the invention: In the first, an intermediate semiconductor is introduced between the core and the outer shell which have a lattice parameter that is intermediate between that of the core and the outer shell. Using this strategy the lattice stress of the heterostructure caused by the difference in the lattice parameter between the core and the outer shell is reduced by the gradual change in lattice parameter moving from the core to the outer shell. Thus, in the example of a heterostructure containing InAs as a core and ZnSe as a shell material, CdSe is introduced as a shell1 material affording an InAs/CdSe/ZnSe heterostructure.

The second strategy is to grow a semiconductor which has a lower (or higher) lattice parameter then that of the core as shell1 followed by another semiconductor (shell 2) with a lattice parameter which is higher (or lower) of that of the core. Using this strategy the lattice stress of the heterostructure caused by the difference in the lattice parameter between the core and shell1 is reduced by shell2 which induces an opposite stress then that of shell 1. An example of a heterostructure prepared using this strategy is InAs/ZnTe/ZnSe.

Implementing the layer by layer growth mechanism and the approach for the reduction of lattice stress enables the formation of defect free and homogenous core/shell1/shell2 QD's with exceptional fluorescence brightness and stability.

This clearly demonstrates the strength of III-V semiconductor core-heteroshell nanocrystals.

The stock precursor solutions used in the preparation of the heterostructures of the present invention are:

1. Cd stock solution. 0.04 M Cd in ODE was prepared by heating CdO (154 mg) and Oleic acid (2.71 g) in ODE (27 ml) at 250° C. under Ar until a colorless solution is obtained (about 30 min).
2. Se stock solution. 0.04 M Se in ODE was prepared by heating Se (95 mg) in ODE (30 ml) at 200° C. under Ar until all the Se powder has dissolved and a yellow clear solution is obtained (about 2 hours).
3. Zn stock solution. 0.04 M Zn in ODE was prepared by simply mixing $Zn(CH_3)_2$, 2M in Toluene (0.20 ml) with ODE (9.8 ml) in a glovebox.
4. S stock solution. 0.04 M S in ODE was prepared by heating S (39 mg) in ODE (30 ml) at 200° C. under Ar until all the S powder has dissolved.

Stock amount calculations. The number of cation or anion moles added for each layer is equal to the number of cations or anions present at the surface of all the particles in solution. This number is calculated taking into account particles size, amount, bond lengths and the densities of the semiconductors being grown. Every layer is considered to be 0.35 nm in thickness, which is the bond length in the growth direction of zinc-blende InAs. For example, when growing a shell on $1.0 \times 10^{-7}$ moles of InAs QD's with an average diameter of 3.8 nm, $1.8 \times 10^{-5}$ moles of Cd and Se are used for the first layer, $2.6 \times 10^{-5}$ moles of Zn and Se for the second layer and $4.1 \times 10^{-5}$ moles of Zn and Se for the third layer.

Optimization of synthetic conditions was achieved following the photoluminescence characteristics i.e. the emission intensity and width. Adding of stock solution to the growth solution was done when the evolution of photoluminescence intensity stopped; typically, about a 10 min interval for the first layer and up to 20 min for the seventh layer. For shell growth on small (~<3 nm) and bigger dots (~>4 nm) it was necessary to optimize the stock amount used for each half-shell growth using the calculated amount as a reference point. The factors used are 1 (4 nm dots) to 0.8 (7 nm dots) for big dots and 1 (4 nm dots) to 0.7 (2 nm dots) for small dots.

Optical Characterization of the Core/Multishell Structures

For time-resolved measurements the sample was excited by 5 ns pulses of the second harmonic (532 nm) of a Nd:YAG laser (Continuum Minilite) at 10 Hz repetition rate. The photoluminescence signal, after dispersion by the detection monochromator, was measured by a PMT (Photo Multiplier Tube) and averaged with a digital oscilloscope. About 600 pulses were used for obtaining one decay curve. The system response time (FWHM) was 10 ns, measured by detecting the scattered laser light.

Structural Characterization of the Core/Multishell Structures

TEM (Transmission Electron Microscopy) Images were taken using a microscope operated at 100 kV. Samples for TEM were prepared by depositing a drop of sample-toluene solution onto 400 mesh copper grids covered with a thin amorphous carbon film, followed by washing with methanol to remove the excess organic residue. XRD (X-Ray Diffraction) measurements were performed on a X-ray diffractometer operated at 40 kV and 30 mA with Cu $K_\alpha$ radiation. Samples were deposited as a thin layer on a low-background scattering quartz substrate. X-ray photoelectron spectroscopy was carried out with an analytical XPS instrument. The measurements were performed on nanocrystals films of monolayer thickness, linked by hexane dithiols to an Au coated substrate.

InAs/CdSe/ZnSe Heterostructure (Core/Shell1/Shell2)

The synthesis of the InAs core was achieved similarly to previously reported syntheses of the material (see for example Banin et al., *Applied Physics Letters* (1998) 69, 1432, and Banin et al., *J. Amer. Chem. Soc.* (2000), 122, 9692).

In a typical synthesis, $1 \times 10^{-7}$ mol of InAs cores dissolved in 700 mg toluene was added under inert and anhydrous atmosphere to 5 g of ODE (Octadecene) and 1.5 g of ODA (Octadecylamine). The amount of InAs was deduced from the weight of the cores. The reaction mixture is next vacuumed and heated gradually to 100° C. still under vacuum to remove residues of volatile solvents and air. The vacuum is switched to Argon flow and the temperature of the mixture is raised to 260° C. At around 200° C. the first aliquot is taken out (shown as layer 0 in the experimental results). The stock containing the amount for the first half layer of Cd precursor is introduced at 260° C. Afterward the Se precursor is introduced. This may be continued sequentially to complete the desired thickness of shell1.

Next, precursors of shell2 are added sequentially, in the present of a Zn precursor to complete half layer followed by a Se precursor and so on. The insertion continues in a variable manner between cations and anions. The time interval between each layer is about 15 min. The calculations of the amounts needed for each half layer is described below. Between stock insertions aliquots are taken to monitor the reaction.

To monitor the progression of the shell growth the photoluminescence was measured during the reaction course. FIG. 2a shows the photoluminescence evolution as a function of number of shell layers grown on a sample of 3.8 nm InAs core dots. The spectra were taken after the growth of every half of a layer, namely after the cation or anion precursor was added and before the addition of the counter-ion precursor.

The first layer grown on the InAs core is of CdSe and the following six layers (forming a single multishell) are ZnSe. There is a significant increase in photoluminescence intensity as the growth of the layer continues. This increase is a result of the high potential barrier imposed by the shell which enables efficient confinement of electron and hole wave functions in the InAs Core and thus diminishes their presence in the vicinity of dark traps located mostly at the nanocrystal surface area.

Two interesting phenomena's are observed in addition to the large increase in photoluminescence intensity. The first is the red shift of the photoluminescence after the growth of the first CdSe layer. This is due to the low potential barrier imposed by the CdSe shell on the InAs core, in particular for the conduction band (CB), allowing tunneling of the electron wavefunction to the surrounding shell. After the addition of only Cd precursors there is a large red shift followed by a significant increase of the photoluminescence intensity. The second phenomenon is the return of the photoluminescence wavelength to its original position after the growth of the ZnSe shell.

Figure 3A:
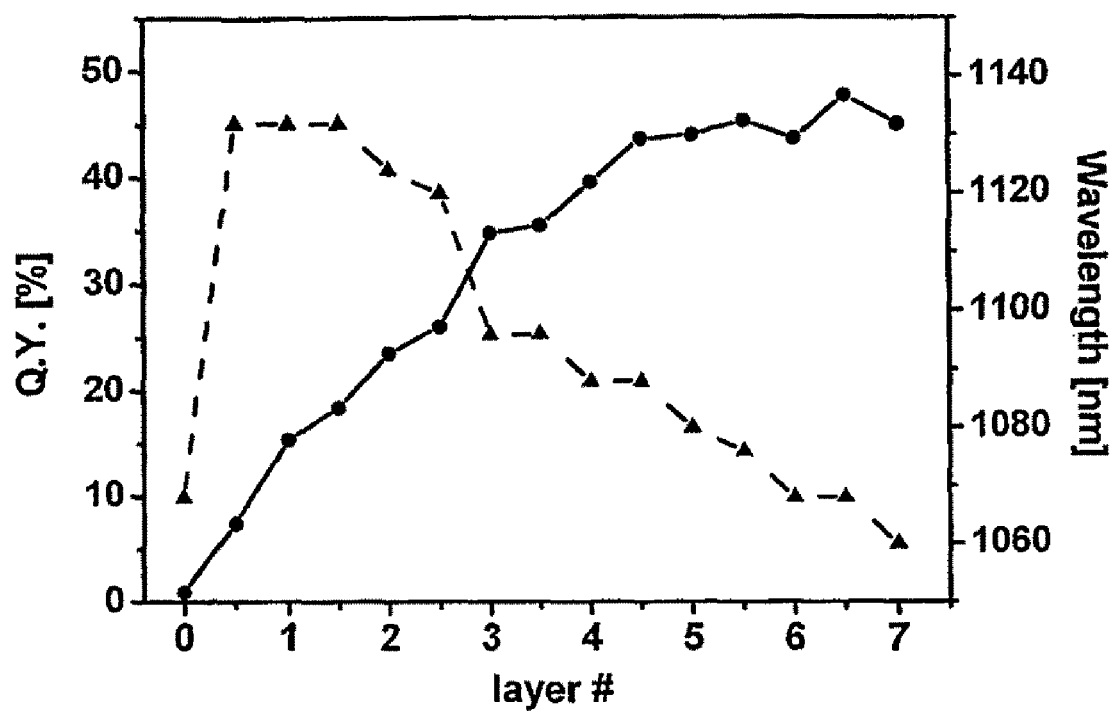
FIG. 3A-B shows the change of the quantum yield in response to the number of layers.
Figure 3B:
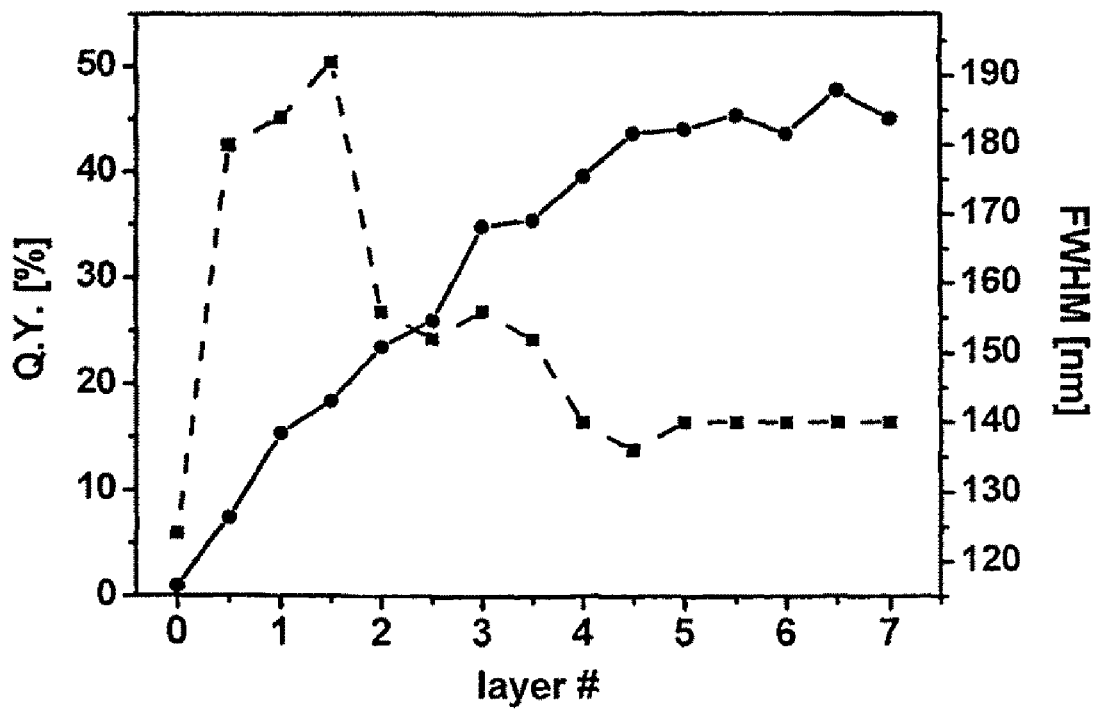

FIG. 3 shows the quantitative results of the photoluminescence evolution shown in FIG. 2. As may be observed, the photoluminescence Quantum Yield increases from 1% before shell growth to 45% after shell growth (FIG. 3a, circles connected by a solid line) and the photoluminescence maximum wavelength red shifts from 1070 nm before shell growth to 1130 nm after the first CdSe layer (FIG. 3a, open triangles connected by a dashed line). As the ZnSe shell growth progresses, the photoluminescence blue shifts back close to its original position.

In addition to wavelength position and intensity the photoluminescence width gives direct information on the homogeneity of shell growth on the core population. A homogenous sample of nanocrystals is of great importance in various applications where for example narrow emission is desired or where self-assembly of the nanocrystals is needed. The small change in FWHM of the photoluminescence is correlated to the unchanged size distribution before and after shell growth as shown and discussed herein below.

InP/ZnSe/ZnS Heterostructure (Core/Shell1/Shell2)

The synthesis of the InP core followed that published earlier (Guzelian et al, *J. Phys. Chem.* (1996) 100, 7212).

The InP dots where etched with HF before shell growth (Talapin et al., *J. Phys. Chem. B* (2002) 106, 12659). The remaining synthetic steps are similar to the one detailed in Example 1 above. For the first layer Zn and Se precursors were used and Zn and S precursors for the subsequent layers.

In order to optimize reaction conditions and procedure several factors including reaction temperature and the number of shell layers of each semiconductor grown were independently evaluated. When considering temperature for shell growth one has to consider two main effects: one being the crystalline quality of the shell grown and the other the surrounding of the particles. Insufficient temperature will result in the growth of an imperfect shell full of dark traps which would lead to the quenching of the photoluminescence. On the other hand performing the reaction at high temperatures may result in nucleation of the shell precursors. The procedure of the present invention provides significantly better results then the ones performed at lower temperatures (not shown). No indication of a nucleation process competing with shell growth was observed.

Figure 4:
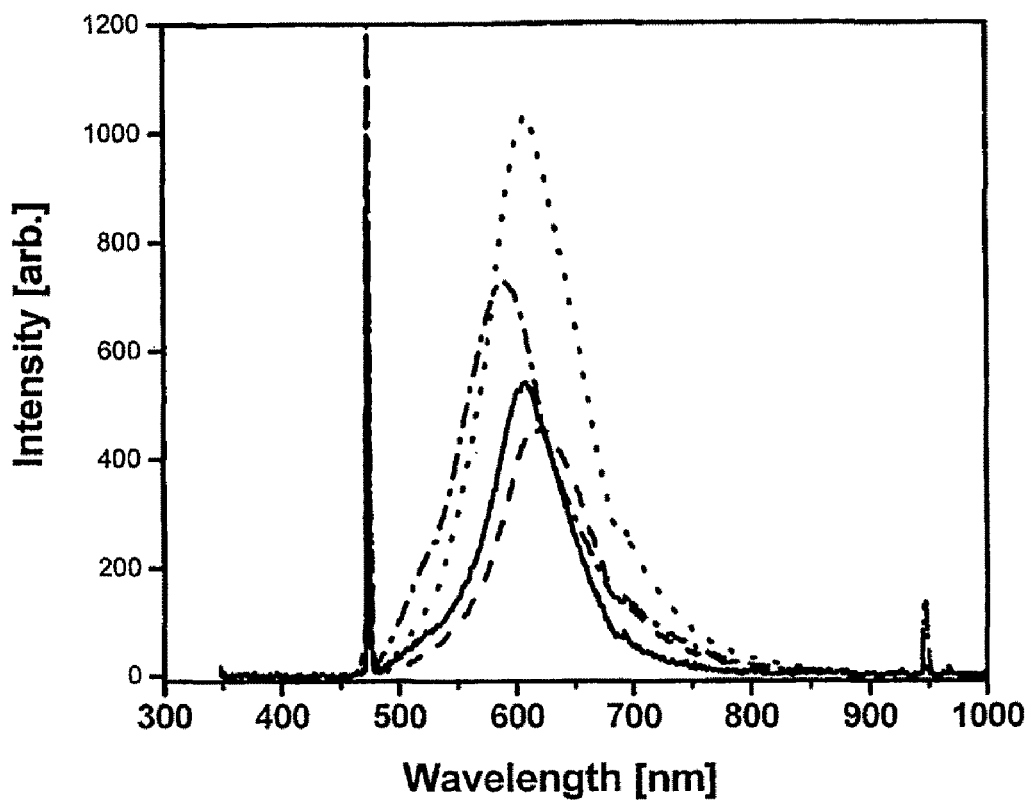
FIG. 4 shows the evolution of the photoluminescence spectra of 2.9 nm InP cores as a function of shell thickness. The first shell grown is ZnSe and the subsequent shell consists of ZnS. In the figure, solid line is of the initial InP core photoluminescence; the remaining curves are the photoluminescence after the growth of the first (ZnSe), second (ZnS) and third layer (ZnS), respectively.

Extrinsic effects such as of the environment surrounding the particles, on the photoluminescence characteristics of the heterostructures of the invention provides information on the effectiveness of the shell barrier. In the case of just core nanocrystals, the chemical separation from the growth solution can result in a significant loss of quantum yield due to the removal of passivating organic ligands and to possible creation of surface traps. In fact, in the present case, not only that the emission was not weakened during separation, an increase in the photoluminescence intensity was observed in the core/multishells of the invention (after separation via methanol precipitation and re-dissolution in toluene). This increase clearly demonstrates the effectiveness of the shell barrier in keeping the exciton away from the surface area. In order to achieve control of the photoluminescence peak position different sizes of InAs cores on which the shell is grown were used. FIG. 4 shows the photoluminescence evolution of InP dots as a result of ZnSe/ZnS shell growth. As the growth continues the photoluminescence intensity increases with no significant shift of the photoluminescence wavelength being observed.

Figure 5:
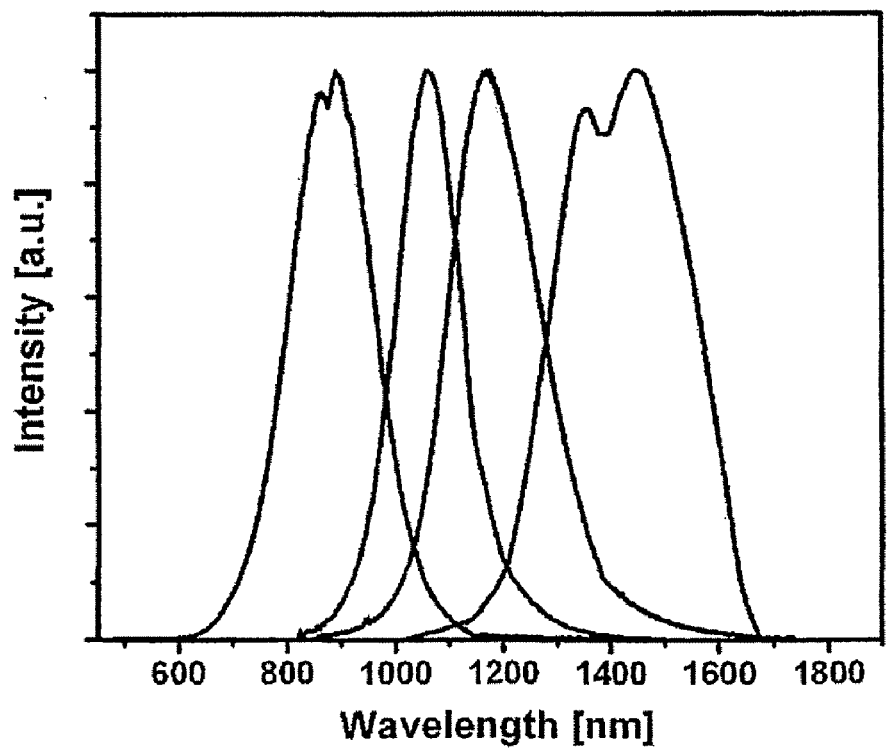
FIG. 5 demonstrates the normalized photoluminescence emission of four heterostructures covering the telecommunication region. The photoluminescence peak position is determined by the size of the cores being used.

By tuning the core nanocrystal size, spectral tuning for the emission may be achieved through the effect of quantum confinement in the cores. FIG. 5 shows the spectral coverage provided by four samples of InAs/CdSe/ZnSe heterostructure particles synthesized using four different sizes of cores emitting at 880, 1060, 1170 and 1420 nm. There is a systematic decrease in the quantum yield going from small heterosturcture (more then 80%) to a large structure (down to 2%). This decrease is correlated with the starting quantum yield of the cores used. There is a substantial compensation of quantum yield of large heterostructures, attained by the layer-by-layer growth method, but still not sufficient enough to equal the intensities reached by the small heterostructures. For example, the increase in photoluminescence intensity of a core emitting at 880 nm is by a factor of 20 while in a large core emitting at 1420 nm the factor is 70.

The lower yield at the larger diameter nanocrystals is believed to be due to an intrinsic effect of reduction in electron-hole overlap due to the very different effective masses of the electron and hole wavefunctions in e.g. InAs. At the same time, exceptional emission is obtained at a diverse range. Through tuning of the composition other spectral ranges are also accessible, for example the use of InP cores to cover the visible to near-IR region is possible. InSb cores may be used to cover wavelengths more towards the red while InAsSb or InAsP cores may be used in to cover the intermediate ranges.

Figure 6:
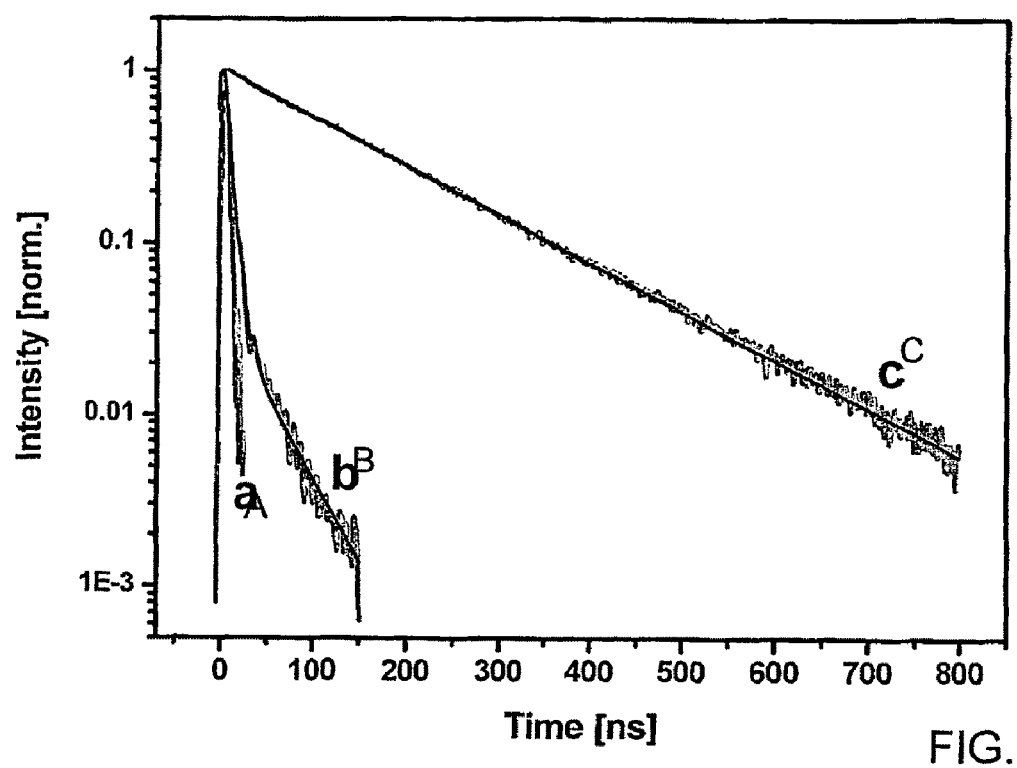
FIG. 6 shows the time resolved fluorescence measurement of InAs based core/shell1/shell2 particles: trace A is the instrument response function. Trace B. is the measured fluorescence decay of 4 nm InAs cores. Trace C is the measured fluorescence decay of the InAs/CdSe/ZnSe product heterostructures made with the same cores. The heterostructure decay is fit to a single exponent (solid line) while the core decay is bi-exponent and the decay time is significantly shorter (solid line). The black line in FIG. 6C is the exponential fit for the heterostructure photoluminescence decay. The black line in trace B is a convolution of the laser decay with an immediate rise. The photoluminescence lifetime increases by a factor of 50 from 3 ns for the cores to 150 ns for the heterostructure.

To further investigate the influence of the double shell on the optical performance of particle cores such as InAs, lifetime measurements of the photoluminescence decay were conducted. FIG. 6 demonstrates the photoluminescence decay of 4 nm InAs cores compared to heterostructure particles made from the very same cores. As shown, the photoluminescence lifetime was increased by a factor of 50 from 3 ns for the cores to 150 ns for the heterostructures. This increase is mainly due to the passivation of the cores surface by the shell material and consequently the significant decrease in non-radiative processes, which quench the photoluminescence.

Figure 7:
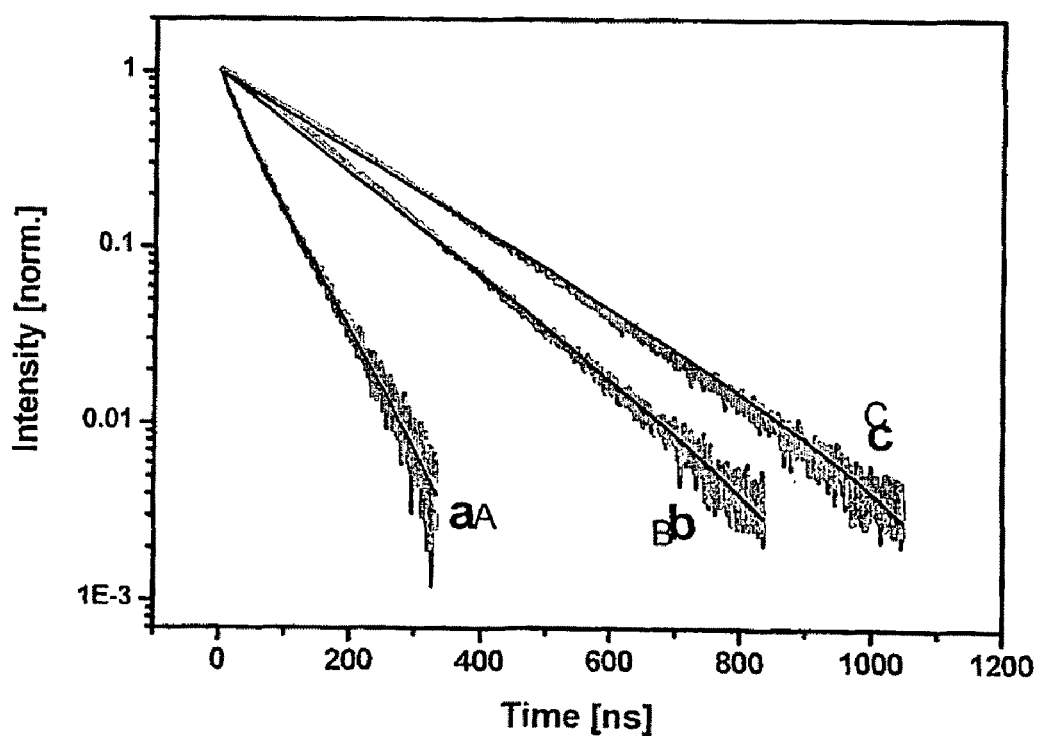
FIG. 7 depicts the time resolved measurement of core/shell1/shell2 heterostructure particles (same as of trace C in FIG. 6) in various mediums: Trace A in a PVB polymer; Trace B in a toluene solution and Trace C in a $C_2Cl_3F_3$ solution. The photoluminescence decay life times are 48 ns, 150 ns and 195 ns, respectively. The solid line in trace A is a bi-exponential fit while in traces B and C it is a single exponential fit. The shorter lifetime in trace B and especially in trace A is probably due to coupling between C—H vibrations in the medium to excited states in the heterostructure.

The medium, which surrounds the heterostructure, also influences the photoluminescence decay lifetime. FIG. 7 shows the photoluminescence decay of 4 nm InAs cores in three different mediums. The fastest decay of 48 ns was observed when the surrounding medium was a PVB (polyvinyl-butyral) polymer (a) and the slowest and longest decay measured at 195 ns was observed in $C_2Cl_3F_3$ medium (c). Without wishing to be bound by theory, this large difference between the two decays most probably stems from the coupling between C—H vibrations in the PVB to excited states in the heterostructure. The coupling, which serves as a non-radiative decay root for the exciton in the heterostructure, does not exist in the $C_2Cl_3F_3$ matrix and therefore the photoluminescence decay is longer. In the toluene matrix (b), which also exhibits C—H vibrations, the photoluminescence decay is longer then in the PVB matrix (a) probably due to the different nature of the C—H vibrations and the difference in the coupling strength between heterostructure to the liquid toluene and heterostructure to the solid PVB.

FIG. 8 shows tunneling electron microscope (TEM) images of InAs cores after (frame a) and before (frame b) shell growth and there size distribution. The cores are 3.8 nm in size and grow to 5.9 nm with the addition of the shell. The size distributions were determined by measuring more than 300 particles of each sample. The standard deviation of the average size of both the cores and the heterostructures are 14%. The unchanged size distribution is a measure of the excellent kinetic control of the shell growth process in this layer-by-layer approach.

Figure 9:
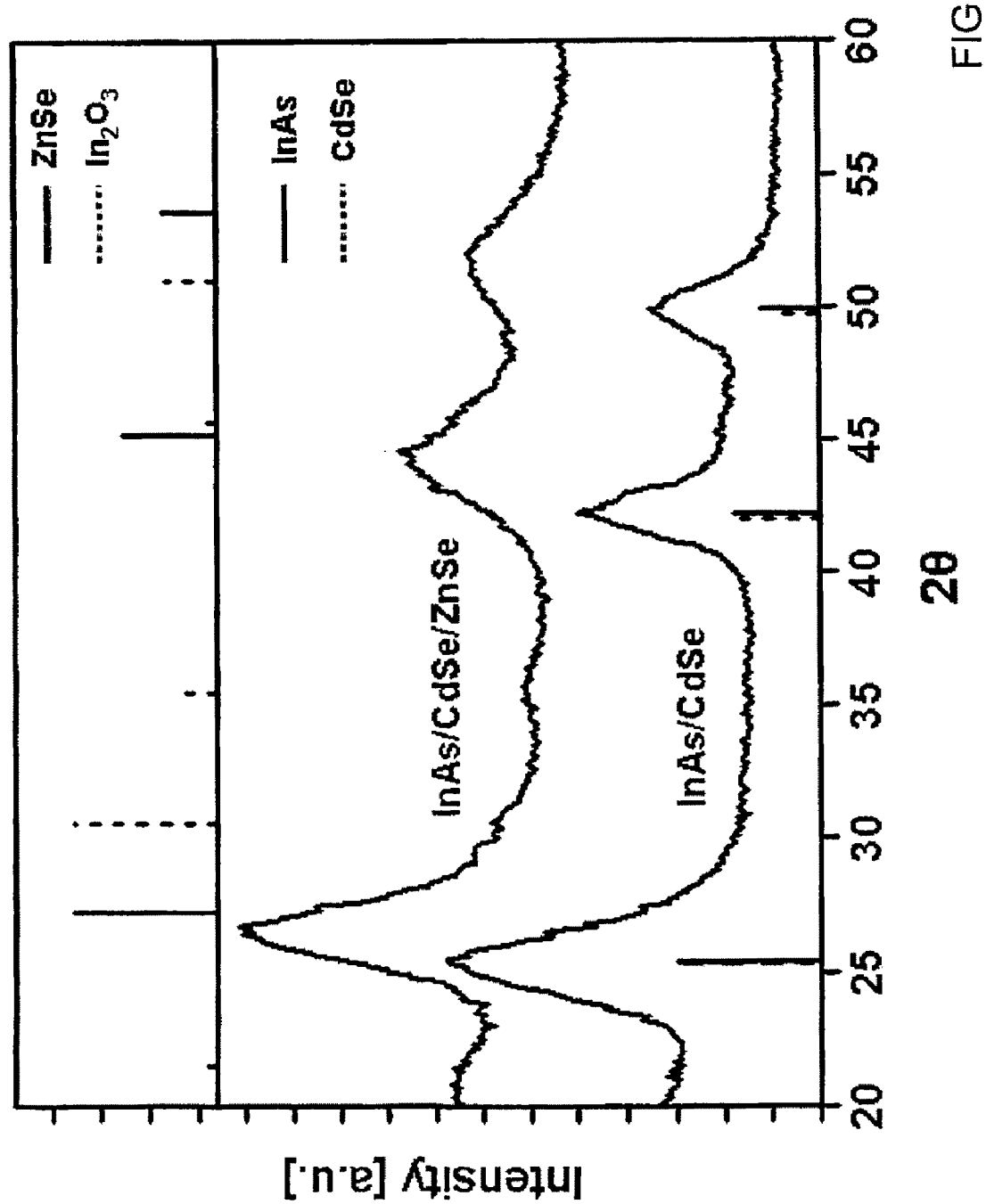
FIG. 9 shows the X-ray powder diffraction spectra of InAs/CdSe core/shell QD's (bottom) and InAs/CdSe/ZnSe core/shell/shell QD's (upper). The lines represent bulk XRD patterns of zinc-blende InAs (solid lines, bottom), CdSe (dashed lines, bottom), ZnSe (solid lines, top) and BCC $In_2O_3$ (dashed lines, top). The XRD patterns are a superposition of the XRD zinc-blende features of the constituent semiconductors.

XRD measurements were utilized for the measurement of the heterostructures' crystalinity. FIG. 9 shows the XRD spectra of an InAs/CdSe heterostructure sample (three layers of CdSe on 3.8 nm InAs cores, bottom spectrum) and of a InAs/CdSe/ZnSe heterostructure sample (Six layer of ZnSe after one layer of CdSe on 3.8 nm InAs cores, upper spectrum). The InAs/CdSe spectrum matches the bulk XRD spectra of InAs and CdSe zinc-blende which peak positions are almost identical. Hence, the CdSe shell growth lattice continues the InAs core crystalinity. The upper InAs/CdSe/ZnSe spectra appear to be a superposition of the InAs, CdSe and ZnSe bulk zinc-blende spectra, which again demonstrates that the ZnSe growth lattice also continues the InAs core crystalinity.

In addition, weak peaks matching $In_2O_3$ BCC (Body Centered Cubic) lattice are also noticeable. This lattice may be formed at the InAs cores surface at high temperatures before the shell growth process begins.

Figure 10:
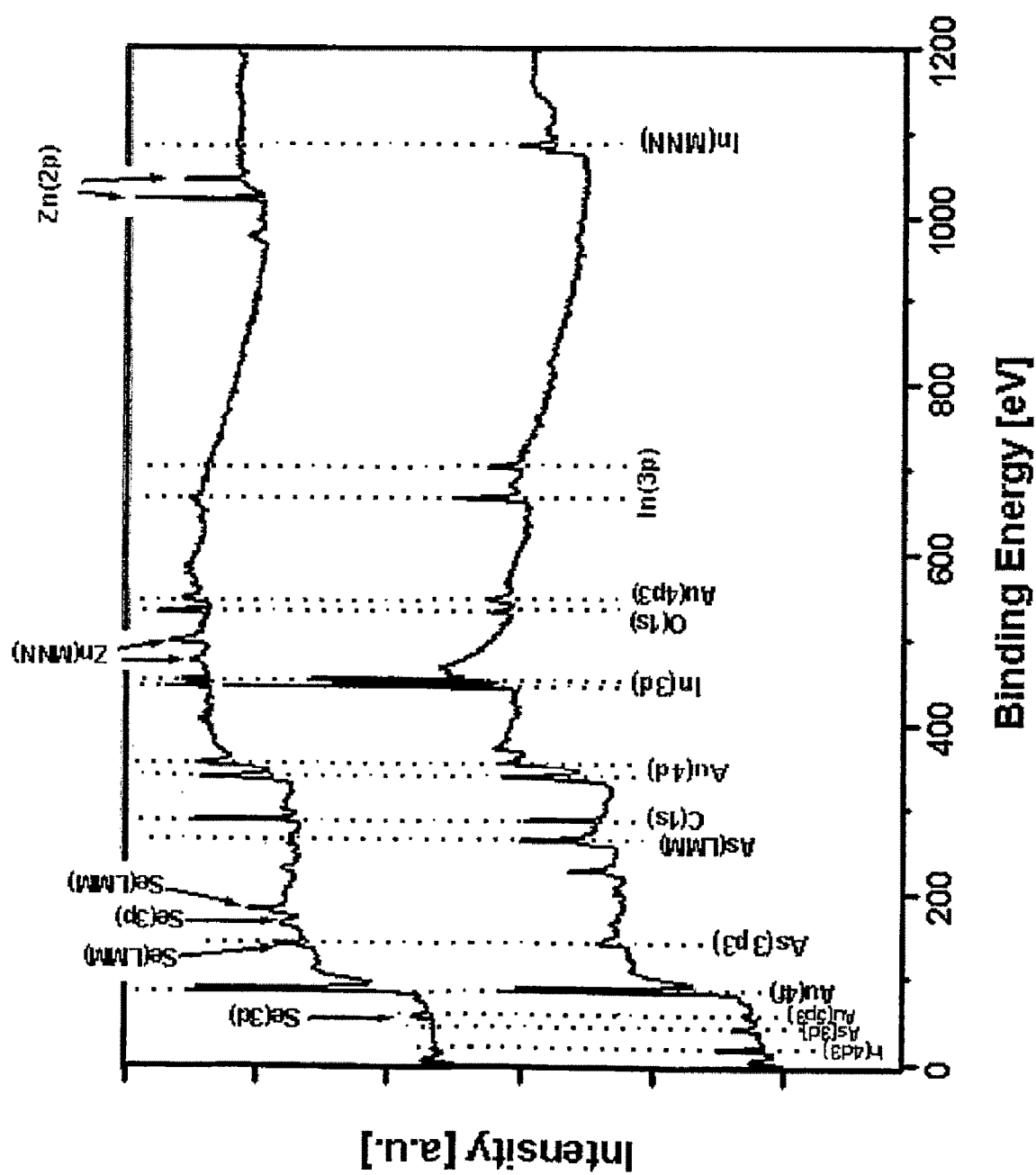
FIG. 10 shows XPS survey of 3.8 nm InAs cores (bottom) and 5.9 nm InAs/CdSe/ZnSe heterostructures' QD's synthesized using the very same cores (up). The assignment of the peaks is indicated. It may be noted that the peaks associated with In and As are missing or reduced in the spectrum of the heterostructure QD's while new peaks of Zn and Se appear, indicating clearly growth of the shell material.

Additional proof of the epitaxial nature of the shell growth is driven from the X-ray photoelectron spectroscopy (XPS) measurements probing the surface of the heterostructures. FIG. 10 shows XPS measurements of InAs cores and InAs/CdSe/ZnSe core/shell/shell heterostructures. Being a surface sensitive technique XPS signal is responsive to the distance of the materials constituent atoms from the surface. In the InAs cores spectra (FIG. 10, bottom) the signal of the various atom levels of In and As are clearly seen as well as of Au which is the surface to which the cores are attached. However, after shell growth (FIG. 10, upper spectra), the In and As atoms signal, being now screened by the shell, decrease significantly or even disappear. Instead, Zn and Se peaks are strongly dominant in the spectrum attesting to epitaxial shell growth.

Figure 11:
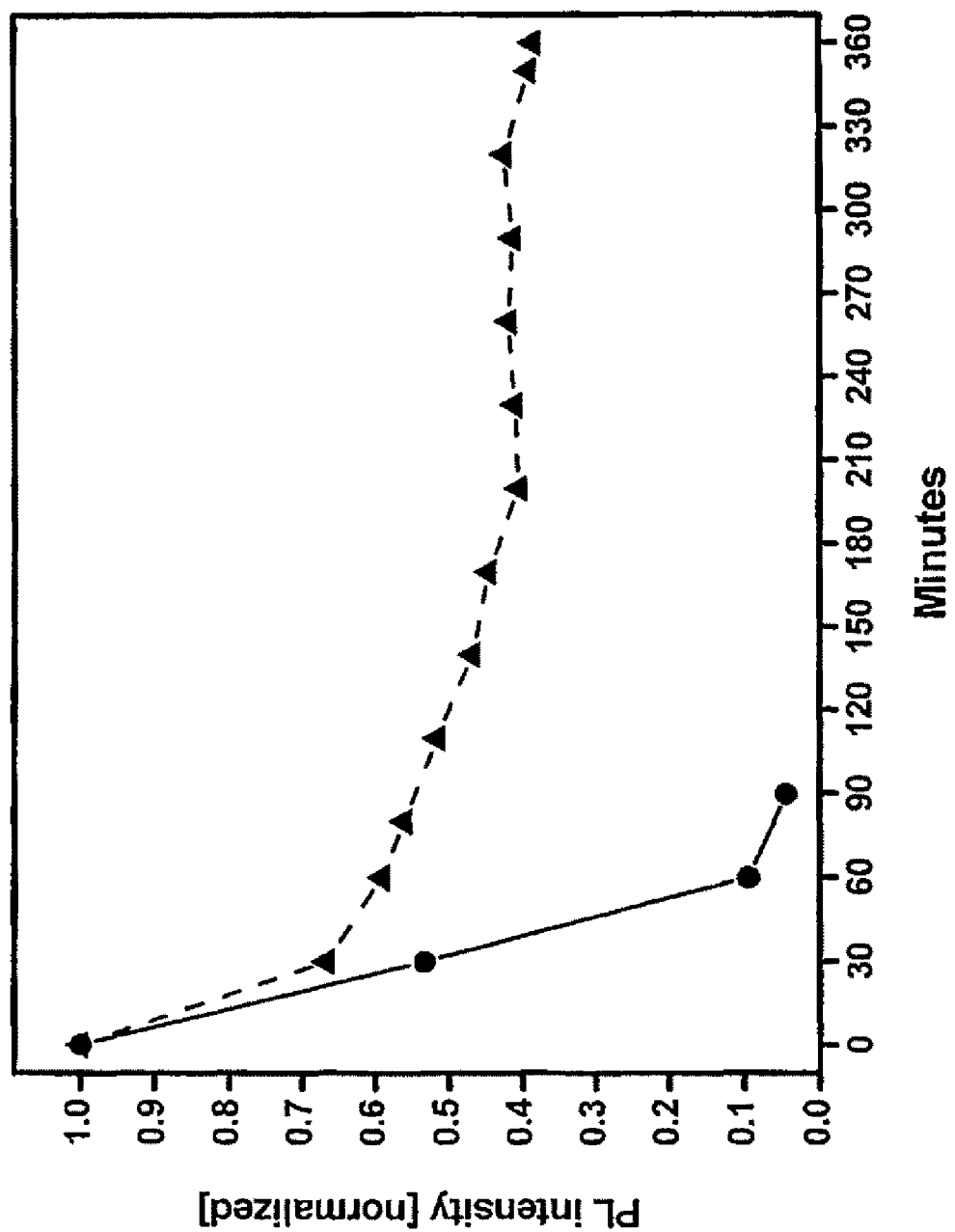
FIG. 11 depicts the photochemical stability of InAs cores (circles) and heterocycles (triangles). The samples were dissolved in toluene and irradiated with 30 mW of 473 nm light.

The significantly improved characteristics of the heterostructure particles are exemplified clearly not only by the significant enhancement in quantum yield but also in the improved stability. FIG. 11 shows the comparison of stability as reflected by relative quantum yield measurements of the original InAs core (same as in previous figures), with the InAs/CdSe/ZnSe heterostructure. For this experiment the solutions containing the nanocrystals were irradiated by a laser at 473 nm and intensity of 30 mW while stirring the solutions to ensure homogenous exposure to the laser. The emission from the solutions was measured over a period of six hours. Unlike with the heterostructures, the cores showed a rapid decay and in fact completely degraded and precipitated out of the solution after about 1 hour. Under the same conditions the heterostructure nanocrystals showed a significantly better performance. After an initial decrease of the quantum yield, the emission stabilized at about 60% of the initial quantum yield, still with an absolute quantum yield of 25%. This is maintained for 6 hours with only a slight and slow decay and the particles remain very stable in solution.

As stated hereinbefore, the heterostructures of the invention may be made to use in a variety of applications. In order to utilize these heterostructures for the various applications it was necessary to imbed them in a solid host. A sufficient solid host had to have several characterizations; (1) it has to be chemically compatible to the surface of the heterostructure, so as to prevent aggregation of heterostructure particles inside the matrix and as a consequence enable a larger concentration (bigger load) of heterostructure particles inside the host; (2) the solid host has to exhibit processability, that is, it has to be easily shaped but yet robust; and (3) for optical application, its optical behavior should be suitable for the application.

As stated above, the chemical compatibility of the host material and the heterostructure is one of the major characteristics of the host. In order to prevent aggregation of the heterostructure there has to be a chemical similarity between the chemical structure of the host and the long-chain amine ligands which cover the heterostructure surface. There are two main groups of ligands which are used to passivate the surface of the heterostructure: polar and non-polar. In the case of ligands which are non-polar, possible comparable hosts are for example, and without being limited thereto: polymers of Polybisphenol, polymers of Polybutadiene, polymers of Polydimethylsiloxane, polymers of Polyethylene, polymers of Polyisobutylene, polymers of Polypropylene, polymers of Polystyrene and Polyvinyl polymers.

In case of ligands which are polar, exemplary comparable hosts are: polymers of Ployacrylamide, polymers of Polyacrylic acids, polymers of Polyacrylonitrile, polymers of Polyaniline, polymers of Polybenzophenon, polymers of poly(methyl mathacrylate), silicone polymers, and Aluminium polymers.

The polymer hosts used within the scope of the present invention are preferably selected from a variety of polyvinyl and fluorinated polymers.

Due to the optical differences between the polyvinyl and fluorinated polymers, the hosts may be chosen to compliment each other at regions of disadvantage. For example, while Polyvinyl is chemically suitable for heterostructure imbedding and while it gives a shining clear brown colored heterostructure/Polyvinyl material without any complicated treatment it is optically inactive in some regions of the NIR spectrum. In those parts of the spectrum a fluorinated polymer is more useful because of their transparency in the NIR region.

For hosts such as PFCB (Perfluorocyclobutyl) polymers that are less chemically suited for heterostructure imbedding, a ligand exchange procedure is applied. In this procedure the ligands covering the heterostructure are replaced with ligands that are chemically suitable to the host. The following is an example for heterostructure imbedding in a polymer matrix.

Imbedding of a Heterostructure in Polyvinyl-Butyral 400 mg of polyvinyl-butyral (grains) was inserted into a 20 ml vial containing 2 g of dissolved heterostructure in toluene (up to 3 OD) and a magnetic stirrer. Then the mixture was stirred vigorously for 4 hours. During the stirring the polymer completely dissolves in the toluene. Next, the stirring was stopped and the solution was left to dry for three days. During the drying period, the toluene evaporated and the heterostructures were trapped inside the polymer chains. The product was a shining transparent free-standing polymer containing the particles. The successfulness of the embedding process was seen from: (1) the color of the composite, said color resulting from the presence of the nanocrystals; (2) the absorption spectra of the composite showing the absorption spectra of the nanocrystals, and (3) from the emission spectra being that of the nanocrystals of the invention.

In a non-limiting example, a specific core/shell1/shell2 structure of InAs/CdSe/ZnSe that yield exceptional fluorescence quantum yield and stability covering the entire NIR spectral range from 800 nm to over 1.6 microns. This spectral range is important for telecommunication applications. It is also important for biological fluorescence tagging and additional tagging applications requiring emission invisible to the naked eye. In another non-limiting example of core/shell1/shell2 structure, heterostructures of InP/ZnSe/ZnS have been prepared with visible to near-IR emission tunable by the core size.

The invention claimed is:

1. A core/multishell semiconductor nanocrystal, comprising:
   a core material comprising a III/V compound; and
   at least two shell materials, comprising
      a first shell material that coats the core material,
      a second shell material that coats the first shell material, and sequentially each subsequent shell material coats a preceding shell,
      each shell material independently comprising a compound selected from a II/VI, a III/V or a III/VI compound, the core material being different from the first shell material, and any shell material is different from a shell material of an adjacent shell, wherein the nanocrystal exhibits a typed band offset and luminescence at a wavelength from about 400 to about 1600 nm, and wherein a band gap of the core material is less than a band gap of the first, second and any subsequent shell materials, the band gap of the first shell material is larger than the band gap of the core material and lower than the band gap of subsequent shell materials, and the band gap of the second or any subsequent shell material is larger than that of the first or preceding shell material and lower than the band gap of any subsequent shell materials.

2. The core/multishell semiconductor nanocrystal according to claim 1, wherein between 2 and 7 shell materials are present.

3. The core/multishell semiconductor nanocrystal of claim 1 being an undoped nanocrystal.

4. The core/multishell semiconductor nanocrystal according to claim 1, consisting of the core material, the first shell material and the second shell material and the first and second shell materials are different materials.

5. The core/multishell semiconductor nanocrystal according to claim 1, wherein the III/V compound is selected from the group consisting of InAs, InP, GaAs, GaP, GaSb, InSb, AlAs, AlP, AlSb, InGaAs, GaAsP, and InAsP.

6. The core/multishell semiconductor nanocrystal according to claim 5, wherein the core material is InAs, InP or GaAs.

7. The core/multishell semiconductor nanocrystal according to claim 1, wherein the at least two shell materials are II/VI compounds.

8. The core/multishell semiconductor nanocrystal according to claim 1, wherein the at least two shell materials are III/V compounds.

9. The core/multishell semiconductor nanocrystal according to claim 1, wherein the at least two shell materials are III/VI compounds.

10. The core/multishell semiconductor nanocrystal according to claim 7, wherein the II/VI compounds are selected from the group consisting of CdS, CdSe, CdTe, ZnS, ZnSe, ZnTe, HgS, HgSe, HgTe, CdZnSe, CdSSe and ZnSSe.

11. The core/multishell semiconductor nanocrystal according to claim 8, wherein the III/V compounds are selected from the group consisting of InAs, GaAs, GaP, GaSb, InP, InSb, AlAs, AlP, AlSb, InGaAs, GaAsP and InAsP.

12. The core/multishell semiconductor nanocrystal according to claim 9, wherein the at least two shell material III/VI compounds are selected from the group consisting of InS, In2S3, InSe, In2Se3, In4Se3, In2Se3, InTe, In2Se3, GaS, Ga2Se3, GaSe, Ga2Se3, GaTe, Ga2Te3, In2Se3-xTex, GaTeSe and (GaxIn1-x)Se3, wherein X is zero or 1.

13. The core/multishell semiconductor nanocrystal according to claim 1 being selected from InAs/CdSe/ZnS, InAs/CdSe/CdS, InAs/InP/ZnSe, InP/ZnSe/ZnS, InP/CdS/ZnSe, InP/CdS/ZnSe, GaAs/CdSe/ZnS, and GaAs/CdS/ZnS.

14. The core/multishell semiconductor nanocrystal according to claim 1 being InAs/CdSe/ZnSe or InP/ZnSe/ZnS.

15. A wideband optical amplifier for amplifying data-carrying optical signals, comprising a plurality of the core/multishell semiconductor nanocrystals according to claim 1, wherein each of the core/multishell nanocrystals has core dimensions that correspond to a specific optical band and is located at a predetermined point within a light transmitting medium; and a pumping, coherent-light source connected to said light transmitting medium for exciting each of the nanocrystals with light energy required for the amplification of data-carrying optical signals within the specific optical band, received in the light transmitting medium.

16. A light-emitting diode comprising a plurality of the core/multishell semiconductor nanocrystals according to claim 1.

17. A biological labeling agent comprising a plurality of the core/multishell semiconductor nanocrystals according to claim 1.

18. A photoelectric device comprising a plurality of the core/multiple shell semiconductor nanocrystals according to claim 1.

19. A laser device comprising a plurality of core/multiple shell semiconductor nanocrystals according to claim 1.

20. An optical data communication system comprising a plurality of the core/multiple shell semiconductor nanocrystals according to claim 1.

21. A host material containing a plurality of the core/multishell semiconductor nanocrystals according to claim 1.

22. The host material according to claim 21 being a polymer.

23. The host material according to claim 22, wherein the polymer is selected from the group consisting of fluorinated polymers, polymers of Ployacrylamide, polymers of Polyacrylic acids, polymers of Polyacrylonitrile, polymers of Polyaniline, polymers of Polybenzophenon, polymers of poly(methyl mathacrylate), silicone polymers, Aluminium polymers, polymers of Polybisphenol, polymers of Polybutadiene, polymers of Polydimethylsiloxane, polymers of Polyethylene, polymers of Polyisobutylene, polymers of Polypropylene, polymers of Polystyrene and Polyvinyl polymers.

24. The host material according to claim 23, wherein the polymer is selected from polyvinyl and fluorinated polymers.

25. The host material according to claim 24, wherein the polymer is polyvinyl-butyral or Perfluorocyclobutyl.

26. A plurality of the core/multishell semiconductor nanocrystals according to claim 1, having luminescence at a wavelength from about 400 to about 1600 nm.

27. A method for the manufacture of a core/multishell semiconductor nanocrystal, according to claim 1, having at least two shells, comprising:
(i) providing a core,
(ii) contacting the core with a solution of a first soluble cation or soluble anion selected from Group IIIa, IIa, Va or VIa ions, allowing the cation or anion to react on the core,
(iii) contacting the core with a counterion, selected from Group IIIa, IIa, Va or VIa ions, of the first soluble cation or soluble anion solution of step (ii) and allowing the counterion to react and afford a core/shell1 structure,
(iv) contacting the core/shell1 structure with a solution of a second soluble cation or soluble anion, selected from Group IIIa, IIa, Va or VIa ions, allowing the cation or anion to react on shell1 of the core/shell1 structure,
(v) contacting the core/shell1 structure with a second counterion selected from Group IIIa, IIa, Va or VIa ions, of the second soluble cation or soluble anion solution of step (iv) and allowing to react and afford a core/shell1/shell2 structure,
(vi) optionally repeating steps (ii) to (v) with one or more further solution of a further soluble cation or soluble anion and subsequently a counterion of the further soluble cation or soluble anion to form a core/multishell semiconductor nanocrystal of a higher order
wherein the core/multishell is undoped and exhibits luminescence at a wavelength from about 400 to about 1600 nm.

28. The method according to claim 27, wherein the core/multishell exhibits a type-1 band offset.

29. The method according to claim 27, further comprising the steps of isolating the core/shell1 and the core/shell1/shell2 structures.

30. The method according to claim 27, wherein the first soluble cation solution is selected from Cd and Zn.

31. The method according to claim 27, wherein the first soluble anion solution is selected from S, Se and P.

32. The method according to claim 27, wherein the second soluble cation solution is selected from Zn and Cd.

33. The method according to claim 27, wherein the second soluble anion solution is selected from S and Se.

* * * * *

UNITED STATES PATENT AND TRADEMARK OFFICE
CERTIFICATE OF CORRECTION

PATENT NO. : 7,964,278 B2  
APPLICATION NO. : 11/922008  
DATED : June 21, 2011  
INVENTOR(S) : Uri Banin and Assaf Aharoni Page 1 of 1

It is certified that error appears in the above-identified patent and that said Letters Patent is hereby corrected as shown below:

IN THE CLAIMS:

Claim 1, Column 15, Line 1,  
Please delete "typed" and replace with -- type-I --

Claim 28, Column 16, Line 67,  
Please delete "type-1" and replace with -- type-I --

Signed and Sealed this  
Sixth Day of September, 2011

David J. Kappos  
*Director of the United States Patent and Trademark Office*